(12) United States Patent
Raley et al.

(10) Patent No.: US 12,265,326 B2
(45) Date of Patent: Apr. 1, 2025

(54) METHOD FOR REDUCING LITHOGRAPHY DEFECTS AND PATTERN TRANSFER

(71) Applicant: Tokyo Electron Limited, Tokyo (JP)

(72) Inventors: Angélique D. Raley, Half Moon, NY (US); Eric Chih-Fang Liu, Albany, NY (US); Nihar Mohanty, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 55 days.

(21) Appl. No.: 17/724,898

(22) Filed: Apr. 20, 2022

(65) Prior Publication Data

US 2022/0244636 A1 Aug. 4, 2022

Related U.S. Application Data

(62) Division of application No. 15/902,858, filed on Feb. 22, 2018, now Pat. No. 11,333,968.

(Continued)

(51) Int. Cl.
*H01L 21/311* (2006.01)
*G03F 1/70* (2012.01)
(Continued)

(52) U.S. Cl.
CPC .............. *G03F 7/0002* (2013.01); *G03F 1/70* (2013.01); *G03F 7/094* (2013.01);
(Continued)

(58) Field of Classification Search
CPC ......... H01L 21/0337; H01L 2924/0002; H01L 21/68; H01L 21/681; H01L 21/3086; H01L 21/0274; H01L 21/0338; H01L 21/3088
See application file for complete search history.

(56) References Cited

U.S. PATENT DOCUMENTS 7,018,780 B2   3/2006  Vahedi et al.
7,910,483 B2   3/2011  Abatchev et al.
(Continued)

OTHER PUBLICATIONS

Taiwan Patent Office, Office Action issued in TW 107105902 dated Aug. 25, 2021.
(Continued)

*Primary Examiner* — Tony Tran
(74) *Attorney, Agent, or Firm* — Wood Herron & Evans LLP

(57) ABSTRACT

An additional non-photoresist layer may be formed on patterned photoresist layers. The additional layer may be preferentially formed on the tops of the photoresist layer versus the sidewalls of the photoresist layer. In addition, the additional layer may be preferential formed on the tops of the photoresist layer versus exposed surfaces of layers underlying the photoresist layer. In this manner, the patterned structures formed by the photoresist layer are less likely to have line opens due to photoresist height variability or the relative thinness of the photoresist height used. Further, the formation of the additional layer may be through a cyclic deposition/trim process. The trim step of the cyclic process may also serve as a descum step that helps reduce line bridging and scumming. In one embodiment, the additional non-photoresist layer may be an organic polymer layer.

12 Claims, 7 Drawing Sheets

Related U.S. Application Data

(60) Provisional application No. 62/574,328, filed on Oct. 19, 2017, provisional application No. 62/461,922, filed on Feb. 22, 2017.

(51) Int. Cl.
| | | |
|---|---|---|
| *G03F 7/00* | (2006.01) | |
| *G03F 7/09* | (2006.01) | |
| *H01L 21/027* | (2006.01) | |
| *H01L 21/033* | (2006.01) | |
| *H01L 21/308* | (2006.01) | |

(52) U.S. Cl.
CPC ...... *H01L 21/0274* (2013.01); *H01L 21/0337* (2013.01); *H01L 21/0338* (2013.01); *H01L 21/3086* (2013.01); *H01L 21/3088* (2013.01); *H01L 21/31144* (2013.01)

(56) References Cited

U.S. PATENT DOCUMENTS

| | | |
|---|---|---|
| 9,607,834 B2 | 3/2017 | Matsumoto et al. |
| 9,818,610 B2 | 11/2017 | Matsumoto et al. |
| 2010/0099046 A1 | 4/2010 | Kim et al. |
| 2010/0266965 A1* | 10/2010 | Schmid .................. B82Y 40/00 430/323 |
| 2016/0293405 A1 | 10/2016 | Matsumoto et al. |
| 2016/0329207 A1 | 11/2016 | Mohanty et al. |
| 2017/0045822 A1 | 2/2017 | Xu |
| 2017/0263443 A1 | 9/2017 | Matsumoto et al. |

OTHER PUBLICATIONS

Taiwan Patent Office, Decision of Refusal issued in TW 107105902 dated Jan. 4, 2022.
PCT Office, International Search Report and Written Opinion issued in PCT/US2018/019270 dated Jun. 8, 2018.
U.S. Patent and Trademark Office, Office Action issued in U.S. Appl. No. 15/902,585 dated Sep. 24, 2019.
U.S. Patent and Trademark Office, Office Action issued in U.S. Appl. No. 15/902,585 dated Mar. 17, 2020.
U.S. Patent and Trademark Office, Office Action issued in U.S. Appl. No. 15/902,585 dated Sep. 23, 2020.
U.S. Patent and Trademark Office, Office Action issued in U.S. Appl. No. 15/902,585 dated Mar. 8, 2021.
U.S. Patent and Trademark Office, Notice of Allowance issued in U.S. Appl. No. 15/902,585 dated Jan. 12, 2022.

* cited by examiner

METHOD FOR REDUCING LITHOGRAPHY DEFECTS AND PATTERN TRANSFER

BACKGROUND

The present disclosure relates to the processing of substrates, such as for example, semiconductor substrates. In particular, it provides a novel method to pattern substrates utilizing very narrow pitch techniques, such used in extreme ultraviolet (EUV) lithography.

As geometries in substrate processing continue to shrink, the technical challenges to forming structures on substrates via photolithography techniques increase. As requirements for 36 nm and lower pitch structures arose, a variety of photolithography techniques have been utilized for achieving suitable photolithography for such narrow pitches including EUV lithography (lithography utilizing wavelengths of light in the EUV range, most typically 13.5 nm wavelengths). However, even shifting to EUV lithography, does not solve all of the technical challenges for 36 nm and lower pitch structures. One of the defects seen when forming such small lithography resist structures is line flop over. To minimize line flop over, thinner resist heights have been proposed. However, thinner resists heights present other problems. For example, resist height variability becomes more problematic if the target resist height is thinner. In addition, thinner resist heights do not provide process margin to deal with bridging and scumming between resist lines. At small geometries, resist bridging and scumming can be problematic. Techniques to remove the bridging and scumming are more difficult with thin resist heights because process margin is lost as removal of the bridging and scumming can cause line opens due to the thinner resist height and etch selectivity.

Thus at small linewidths it is difficult to provide a suitable process window between the tradeoffs of resist line flop over, line bridging and line opens. This is particularly problematic for EUV lithography techniques for 32 nm and lower pitch structures.

It would be desirable to provide a lithography integration technique that reduces that provides an improved process window the small linewidth structures utilized in EUV and other lithography techniques.

SUMMARY

Described herein is an innovative method to process very thin photolithography structures. More particularly, patterned photoresist structures may be provided with a first thickness. The photoresist thickness may be lessened without sacrificing other process characteristics by forming an additional non-photoresist layer on the photoresist. The additional layer may be preferentially formed on the tops of the photoresist layer versus the sidewalls of the photoresist layer. In addition, the additional layer may be preferential formed on the tops of the photoresist layer versus exposed surfaces of layers underlying the photoresist layer. In this manner, the patterned structures formed by the photoresist layer are less likely to have line opens due to photoresist height variability or the relative thinness of the photoresist height used. Further, the formation of the additional layer may be through a cyclic deposition/trim process. The trim portion or step of the cyclic process may also serve as a descum step that helps reduce line bridging and scumming. In one embodiment, the additional non-photoresist layer may be an organic polymer layer.

In one embodiment, a method for processing a substrate is provided. The method may comprise providing the substrate with a plurality of patterned structures overlying at least a first underlying layer. The method may further comprise forming an additional non-photoresist layer on the plurality of patterned structures while at least portions of the first underlying layer are exposed. The forming the additional non-photoresist layer is performed so that more of the additional non-photoresist layer is formed on the tops of the plurality of patterned structures than on the sidewalls of the plurality of patterned structures. The forming the additional non-photoresist layer is also performed so that more of the additional non-photoresist layer is formed on the tops of the plurality of patterned structures than on exposed portions of the first underlying layer. A sidewall thickness of the additional non-photoresist layer formed on the sidewalls of the plurality of patterned structures is less than or equal to 30% of a top thickness of the additional non-photoresist layer formed on the tops of the plurality of patterned structures. The method may further comprise etching the first underlying layer utilizing a combination of the first patterned structures and the additional non-photoresist layer as a mask to pattern the first underlying layer. The formation of the additional non-photoresist layer on the plurality of patterned structures is controlled to provide for improved line open characteristics during processing of the substrate.

In another embodiment, a method for processing a substrate is provided. The method may comprise providing the substrate with an underlying layer and providing the substrate with a first photolithography layer. The method may further comprise providing the substrate with a plurality of patterned photoresist structures, the first photolithography layer being between the underlying layer and the plurality of patterned photoresist structures. The method further comprises removing at least portions of the first photolithography layer while using the patterned photoresist structures as a mask during the removal of the portions of the first photolithography layer. The method further comprises forming a non-photoresist layer on the plurality of patterned photoresist structures after removal of the portions of the first photolithography layer, the forming the non-photoresist layer being performed so that more of the non-photoresist layer is formed on the tops of the plurality of patterned photoresist structures than on the sidewalls of the plurality of patterned photoresist structures. The method also comprises etching the underlying layer utilizing a combination of the first patterned photoresist structures and the non-photoresist layer as a mask during etching of the underlying layer. The formation of the non-photoresist layer on the plurality of patterned photoresist structures is controlled to provide for improved line open characteristics during processing of the substrate.

In yet another embodiment, a method for processing a substrate is provided. The method may comprise providing the substrate with a first relief pattern comprised of a photoresist material, the first relief pattern including structures having top portions and sidewall portions, the first relief pattern positioned on an underlying layer. The method further comprises executing a deposition process that deposits an organic polymer on the first relief pattern, the deposition process including a plasma-based deposition process that includes a curing agent generating vacuum ultraviolet (VUV) light during plasma-based deposition. The method further comprises executing a trim process. The method also comprises controlling the deposition and trim processes such that more organic polymer is deposited on top portions of the structures of the first relief pattern as compared to organic polymer deposited on sidewall portions of the structures of the first relief pattern. The controlling the deposition and trim corrects height variation of the first relief pattern, removes scumming, minimizes single line opens, and provides for a wider process window for utilizing the first relief pattern for as a masking pattern.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1:
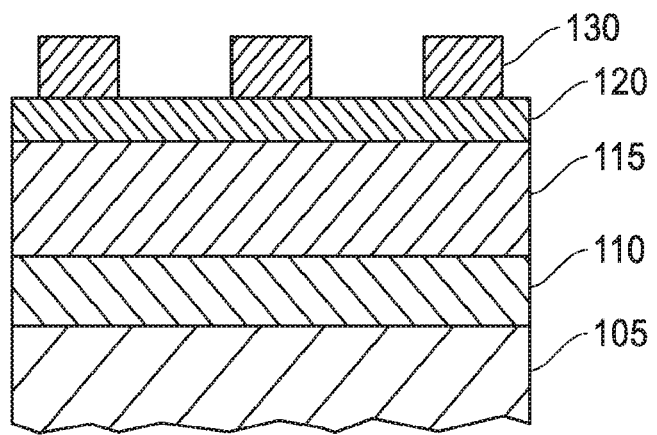
FIGS. 1-4 illustrate exemplary process steps for one embodiment of an exemplary lithography process flow.

As shown in FIGS. 1-4, a process is illustrated that provides an improved process window for etching a layer utilizing lithography techniques. As shown in FIG. 1, an EUV resist layer 130 may be patterned to have a plurality of patterned structures which form patterned photoresist structures. The patterned structures of the patterned EUV resist layer 130 may be formed utilizing EUV lithography techniques known in the art. A plurality of other lithography layers may be provided between the EUV resist layer 130 and the layer to be etched, target etch layer 110. It will be recognized that although the concepts described herein are provided with regard to EUV lithography techniques, the concepts described herein may be also applicable to other lithography techniques, including those with pitches narrower than those achievable with EUV lithography techniques. Thus, the use of the concepts described herein for the formation of structures having pitches of 32 nm minimum pitch or less through EUV lithography techniques will be recognized to be merely exemplary.

Substrate 105 may underlie the target etch layer 110. Target etch layer 110 may be any substrate layer for which patterning is desired, such as for example, but not limited to dielectric layers or conductive layers. Substrate 105 may be any substrate for which the use of patterned features is desirable. For example, in one embodiment, substrate 105 may be a semiconductor substrate having one or more semiconductor processing layers formed thereon. In one embodiment, the substrate 105 may be a substrate that has been subject to multiple semiconductor processing steps which yield a wide variety of structures and layers, all of which are known in the substrate processing art and may be considered to be part of the substrate 105. In one embodiment, the concepts disclosed herein may be utilized at a backend of line (BEOL) processing step. In other embodiments, the concepts disclosed herein may be utilized at a front end of line (FEOL) process step. The techniques described herein may be utilized to provide narrow masking layer linewidths while allowing for an improved process window to minimize line bridging and line opens.

As mentioned, one or more intervening lithography layers may be provided between the patterned EUV resist layer 130 and the target etch layer 110. Thus, as shown in one exemplary embodiment of FIG. 1, a bottom antireflective coating (BARC) layer, BARC layer 120, operating as an antireflective coating layer is provided. A planarization layer 115 may also be provided. It will be recognized that the particular stack of intervening lithography layers may vary while still obtaining the benefits of the concepts described herein. Thus, for example, more or less layers may be utilized. For example, an antireflective layer need not be utilized or multiple antireflective layers may be utilized (such as, for example, the use of both a top antireflective layer and a BARC layer, multiple BARC layers, etc.). In one alternative embodiment, a dielectric layer may be provided between the planarization layer 115 and the BARC layer 120. Other additional layers, such as an etch stop layers, hard mask layers, etc., may also be provided. Further, the particular composition of each layer may vary and the layers may be deposited in a variety of manners, as would be recognized in the art. In one embodiment, the planarization layer may be an organic planarization layer and, in another embodiment, it may be a spin on hard mask layer. It will be recognized, however, that other materials and thicknesses may be utilized for the planarization layer. Thus, it will be recognized that the structures shown in FIG. 1 are merely exemplary and that the techniques described herein may be incorporated into a wide variety of lithography process flows, all as would be apparent to one skilled in the art having the benefit of this disclosure.

Figure 2:
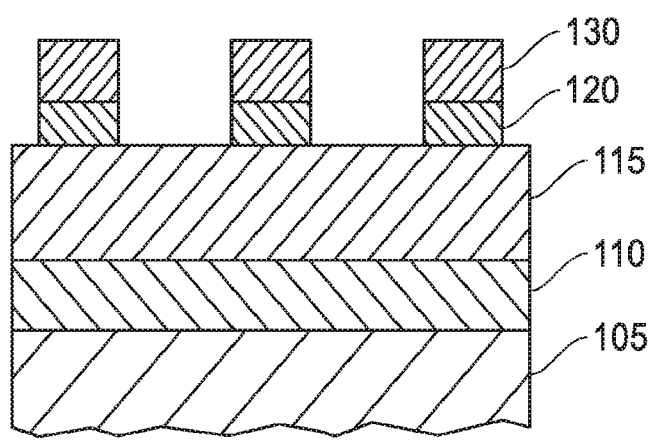
Figure 3:
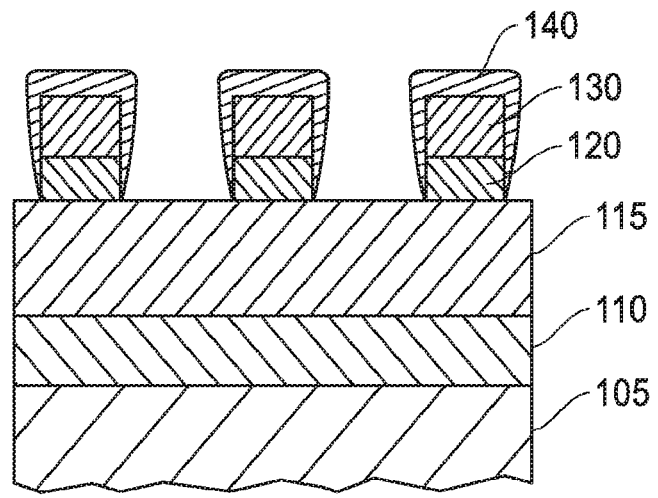

Processing of the structures shown in FIG. 1 may proceed to the state shown in FIG. 2 by opening the BARC layer 120 as shown. As shown in FIG. 3, an organic polymer layer 140 may be formed over the patterned EUV resist layer 130. A characteristic of the organic polymer layer 140 is that it formed primarily on the top of the patterned EUV resist layer 130. Thus, the formation of the organic polymer layer 140 is minimized on the sidewalls of the EUV resist layer 130. In one embodiment, the EUV resist layer 130 may have a thickness height in a range of about 10 nm to 35 nm and more specifically in a range of 10 nm to 20 nm as originally formed. As known in the art, subsequent processing, such as the BARC removal step of FIG. 2 may thin the EUV resist layer 130. The thickness of the organic polymer layer 140 as formed on the top if the EUV resist layer may have a thickness height in a range of about 1 nm to 5 nm and more specifically in a range of 2 nm to 3 nm as originally formed. In one embodiment, the thickness of the organic polymer layer 140 on the sidewalls of the EUV resist layer 130 may be in the range of 10 to 30% of the thickness of the organic polymer layer 140 on the top of the EUV resist layer 130, and more preferable in the range of 10 to 15% of the top thickness. In one exemplary embodiment, organic polymer layer 140 may be formed in a manner such that substantially no organic polymer forms on the top of the planarization layer 115. In other embodiments, organic polymer layer 140 may be formed on the top surface of the planarization layer 115. However such formation on the top surface of the planarization layer 115 may be an amount less than the formation on the top of the EUV resist layer 130. Thus, in such embodiments the formation of the organic polymer layer 140 on the planarization layer 115 may be in the range of 10 to 30% of the thickness of the organic polymer layer 140 on the top of the EUV resist layer 130, and more preferable in the range of 10 to 15% of the top thickness.

In some embodiments, the formation of the organic polymer layer 140 may be accomplished in a manner such that not only is more organic polymer formed on the tops of the EUV resist layer 130, the organic polymer has a reverse taper profile on the sidewalls of the EUV resist layer 130 resulting from the formation process. Thus, the organic polymer layer 140 may be thinnest at lower portions of the EUV resist layer 130.

As will be understood more clearly having reviewed this disclosure in the entirety, the formation of an additional non-photoresist layer on top of the EUV resist layer 130 provides for an improved photolithographic process window. More specifically, without significantly impacting the linewidths formed, the height of the photolithographic patterned structure has been increased. Such increased height allows for increased processing to remove scumming and bridging (for example through the use of a descum process) while leaving sufficient height to the patterned structure such that line opens will not be formed as the result of the descum process or result of subsequent etch stops that are used to ultimately pattern the target etch layer 110 as described in more detail below.

Though described herein with respect to an organic polymer layer 140 that serves as an additional layer on top of the resist, it will be recognized that the organic polymer layer 140 may be formed of other materials, and the techniques described herein are not limited to an organic polymer material. Thus, the advantages and process window margins described herein may be achieved through other materials where the formation of the material results in greater deposition thicknesses on the top of the resist as compared to the thicknesses on the sidewalls of the resist and as compared to the thicknesses on exposed surfaces where resist is absent. Further, the additional layer formed on top of the resist may be achieved through a variety of techniques. In one embodiment, a single deposition process may be utilized. In another embodiment, a cyclic deposition process may be utilized in which material is formed over the substrate and then a trim (or etch) is performed (such as one deposition/trim cycle) or a cyclic deposition process which involves repeated cycles of deposition then trim, another deposition then another trim, and so on. For example, more than one cycle of the deposition/trim process may occur. In one embodiment three cycles may be utilized, in another embodiment six cycles may be utilized. Further, though the figures show ideal resist patterning without bridging and scumming, it will be recognized that bridging and scumming of resist may result between resist lines. This could result in inadequate removal of the BARC layer or even remnant resist on top of the BARC layer after the BARC removal step. The use of a trim step during formation of the organic polymer layer 140 may also advantageously remove any undesired scumming and bridging of the resist layer and/or the BARC layer. Thus, the cyclic process described herein may beneficially form the organic polymer layer 140 on the tops of the patterned EUV resist layer 130 while also decreasing any bridging and scumming. In this manner, the trim step may also be considered to be a descum step.

One exemplary process for formation of the organic polymer layer 140 is disclosed in published U.S. Patent Application Publication No. US2016/0329207 entitled "Method for Processing Photoresist Materials and Structure" to Mohanty et al., published Nov. 10, 2016, the disclosure of which is expressly incorporated herein by reference in its entirety. Thus, in such an exemplary process, the deposition process includes using a plasma-based deposition process that includes a curing agent. The curing agent generates vacuum ultraviolet (VUV) light during plasma-based deposition. VUV light is typically between about 10 nm to 200 nm. Exposing photoresist material to VUV light is beneficial because such radiation can harden a given photoresist by interacting with the carbon-oxygen bonds. These bonds and or lactone groups and other constituents can absorb VUV light. The deposition process is controlled such that more organic polymer layer 140 is deposited on upper portions of the patterned EUV resist layer 130 as compared to organic polymer layer 140 deposited on lower sidewall portions of the patterned EUV resist layer 130. Controlling the deposition process can include maintaining an isotropic deposition during plasma-based deposition. An isotropic deposition can be maintained by not using a substrate bias that would accelerate ions toward the substrate. Instead, essentially a line-of-sight deposition condition is created which results in more deposition on tops of features.

The processing can also include executing a trim process that etches a portion of the organic polymer. The trim process is a plasma-based process that includes a trim agent selected from the group comprised of oxygen-containing gas, hydrogen-containing gas, and nitrogen-containing gas. For example, $CO_2$ can be used as a trim agent. Some deposition gasses can be included for passivation. The trim process can include clearing organic polymer layer 140 from surfaces of the planarization layer 115. A directional (anisotropic) etch or partially-directional etch can be used to clear organic polymer layer 140 from the planarization layer 115. In some embodiments, organic polymer layer 140 can be cleared from top surfaces of the patterned EUV resist layer 130, or partially removed from such top surfaces. With isotropic deposition, more organic polymer layer 140 can be deposited on such top resist structures as compared to exposed surfaces of the planarization layer 115. The combination of the deposition and trim characteristics may result in a structure such as shown in FIG. 3.

In some embodiments, the deposition process and the trim process can be cycled create a predetermined amount of thickness of the organic polymer layer on the top of the EUV resist layer 130, the sidewalls of the EUV resist layer 130 and the exposed surfaces of the planarization layer 115. Executing the deposition process can include flowing a process chemistry into a plasma processing chamber with the process chemistry including $C_xH_y$ in an amount that is greater than 20% by volume of total process gas flow into the plasma processing chamber. In one example, $CH_4$ may be utilized in combination with Argon during deposition. In one embodiment, the trim step may include the use of $CO_2$ and $CH_4$ gas chemistry. In some embodiments the deposition process and the trim process are both executed in a same plasma processing chamber. The curing agent can be selected from any of argon, helium, hydrogen bromide, hydrogen, $C_xF_y$, xenon, neon, or combinations thereof.

The amount of formation of the organic polymer layer 140 on other exposed layers of the substrate 105 may vary depending upon the exposed material. Thus, ability to selectively form the organic polymer layer 140 on the tops of patterned EUV resist layer 130 will limiting formation on the exposed planarization layer 115 will depend upon the material the planarization layer 115 is comprised of. Thus, as mentioned above, one desirable material for use of planarization layer 115 is an organic planarization material which provides advantages differential deposition as compared to deposition on the top of the resist layer. As shown in the example process flow in FIGS. 1-3, the BARC layer 120 has been removed prior to the formation of organic polymer layer 140. BARC layer 120 is removed because typical BARC materials result in less differential between the organic polymer layer 140 deposited on the top of patterned EUV resist layer versus the deposition on exposed BARC areas. Specifically, the sticking coefficient for deposition of the organic polymer on the BARC is such that additional organic polymer may deposit on the BARC. In such case the differential of the deposition of organic polymer layer 140 on the top of the EUV resist layer 130 may not be enough. In one embodiment, an silicon antireflective layer may be utilized as such material may provide a suitable difference between depositions on the silicon antireflective coating and the EUV resist. Thus, it will be recognized that the techniques described herein may be adapted to a wide variety of photolithography process flows and materials and the particular implementation and order of the particular steps disclosed herein may be adapted to account for the different layers and different materials utilized in any particular photolithography process flow.

Figure 4:
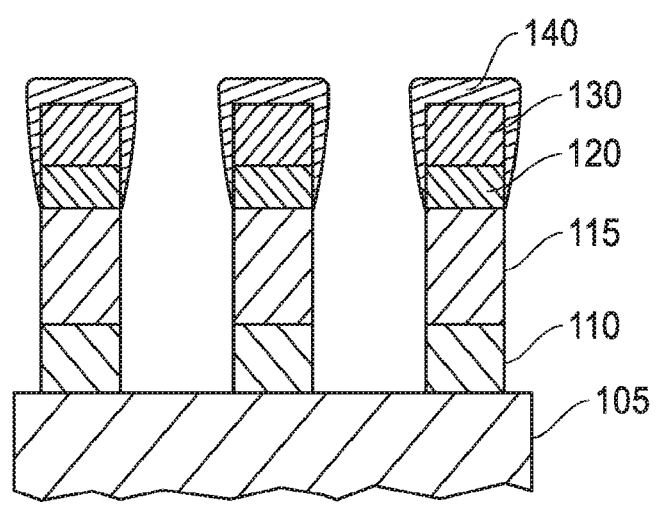

After processing as shown in FIG. 3, the planarization layer 115 may be opened. Finally, target etch layer 110 may be etched as shown in FIG. 4. The etching of planarization layer 115 and target etch layer 110 may be performed in one plasma process, may be performed as multiple steps of a single plasma process or may be performed in separate plasma processes, all as would be recognized by thus skilled in the art. Further, in one advantageous exemplary embodiment, the etch of BARC layer 120, the cyclic deposition of organic polymer layer 140, the etch of planarization layer 115 and the etch of target etch layer 110 may all be performed in one plasma process chamber using separate plasma process steps. Thus, the various operations may be different sub-steps of a single plasma processing step.

It will be recognized that the substrate 105 may be comprised of one or many layers. For example, the substrate 105 may be a semiconductor wafer that has many process layers formed on or in the semiconductor wafer. Thus, for example, the substrate 105 may be a semiconductor wafer at any process step in a semiconductor processing flow. Further, it will be recognized that many of the layers shown in the figures may be considered to be part of the substrate. For example, the substrate 105 may comprise a semiconductor wafer and all of its accompanying layers formed up to any particular process step. Further, it will be recognized that the various process layers and structures shown may be utilized with additional intervening process layers and coatings as would be understood by those in the art. Thus, for example, more or less materials may be utilized between the EUV resist layer 130 and the substrate 105. Thus, it will be recognized that the concepts disclosed herein regarding the use of a an additional top coating on a patterned EUV resist layer may be accomplished within a wide variety of process flows, all of which may advantageously benefit from the characteristics that such top coating provides. Further, as mentioned above, the concepts disclosed herein are not limited to EUV resist layers, but may be applicable to other types of resist. In this manner, techniques are disclosed herein which provide improved process window characteristics to minimize and reducing line bridging and scumming while at the same time minimizing and reducing line opens.

Figure 5:
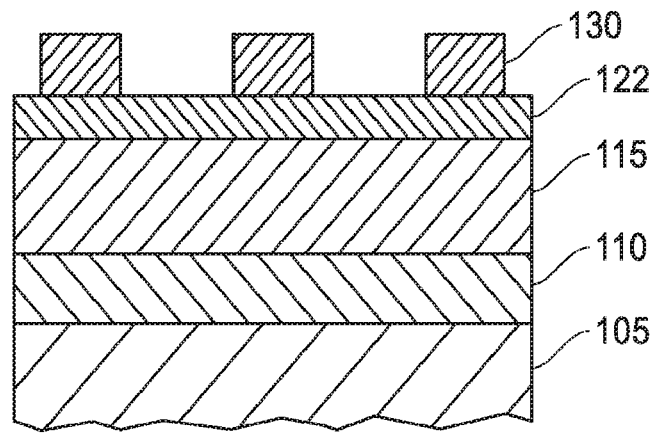
FIGS. 5-7 illustrate exemplary process steps for another embodiment of an exemplary lithography process flow.
Figure 6:
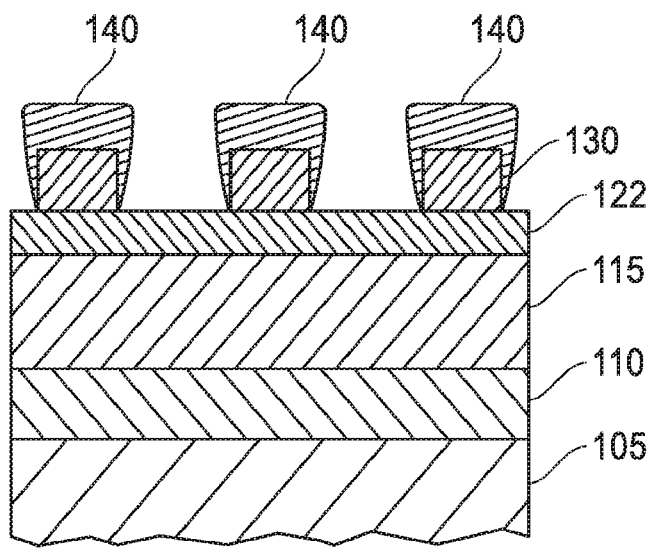
Figure 7:
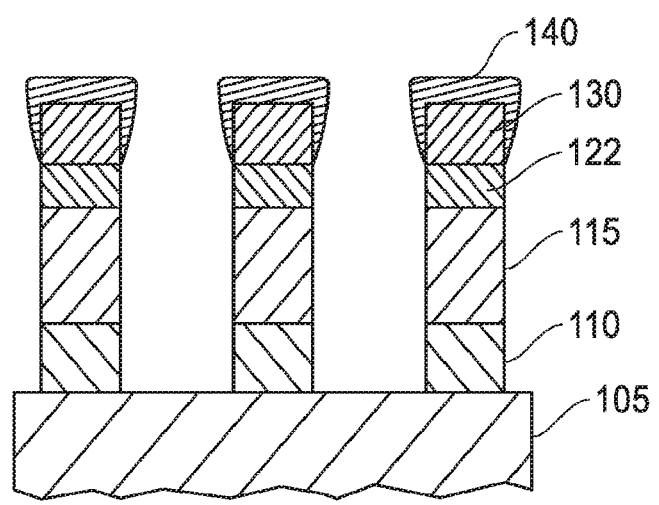

As mentioned above, in one alternative embodiment the layer directly underlying the EUV resist layer 130 may be a layer other than a BARC layer. For example, layer 122 may underlie EUV resist layer 130 as shown in FIG. 5. Layer 122 may be a layer that provides a suitable differential deposition of the organic polymer layer 140 between the deposition on the EUV resist layer 130 and on the layer 122. In one embodiment, layer 122 may be a silicon antireflective coating layer or an amorphous silicon layer. The use of such layer 122 is shown in FIGS. 5-7. The process of FIGS. 5-7 is similar to the process of FIGS. 1-4. The structure of FIG. 5 is similar to that of FIG. 1, except layer 122 is used in place of BARC layer 120. FIG. 6 is similar to FIG. 3, except that the organic polymer layer 140 is deposited before layer 122 is etched such as shown in FIG. 6. As shown in FIG. 7, the resulting structure in FIG. 7 is similar to the structure of FIG. 4, except, as mentioned, layer 122 has been etched after formation of organic polymer layer 140.

It will be recognized that some aspects of the figures show idealized results for etch selectivity between the photolithography layers and the layers being etched. FIGS. 4 and 7 illustrate both the organic polymer layer 140 and the EUV resist layer 130 fully remaining after etch of the planarization layer 115. However, practical etch selectivity will result in loss of both the organic polymer layer 140 and the EUV resist layer 130, as would be recognized by those skilled in the art. Moreover, depending upon the materials and thicknesses utilized, complete removal of both the organic polymer layer 140 and the EUV resist layer 130 can occur during etch of the planarization layer 115. In such case, the pattern in BARC layer 120 or layer 122 remains, however, to provide a masking effect during the etch of planarization layer 115.

Figure 8:
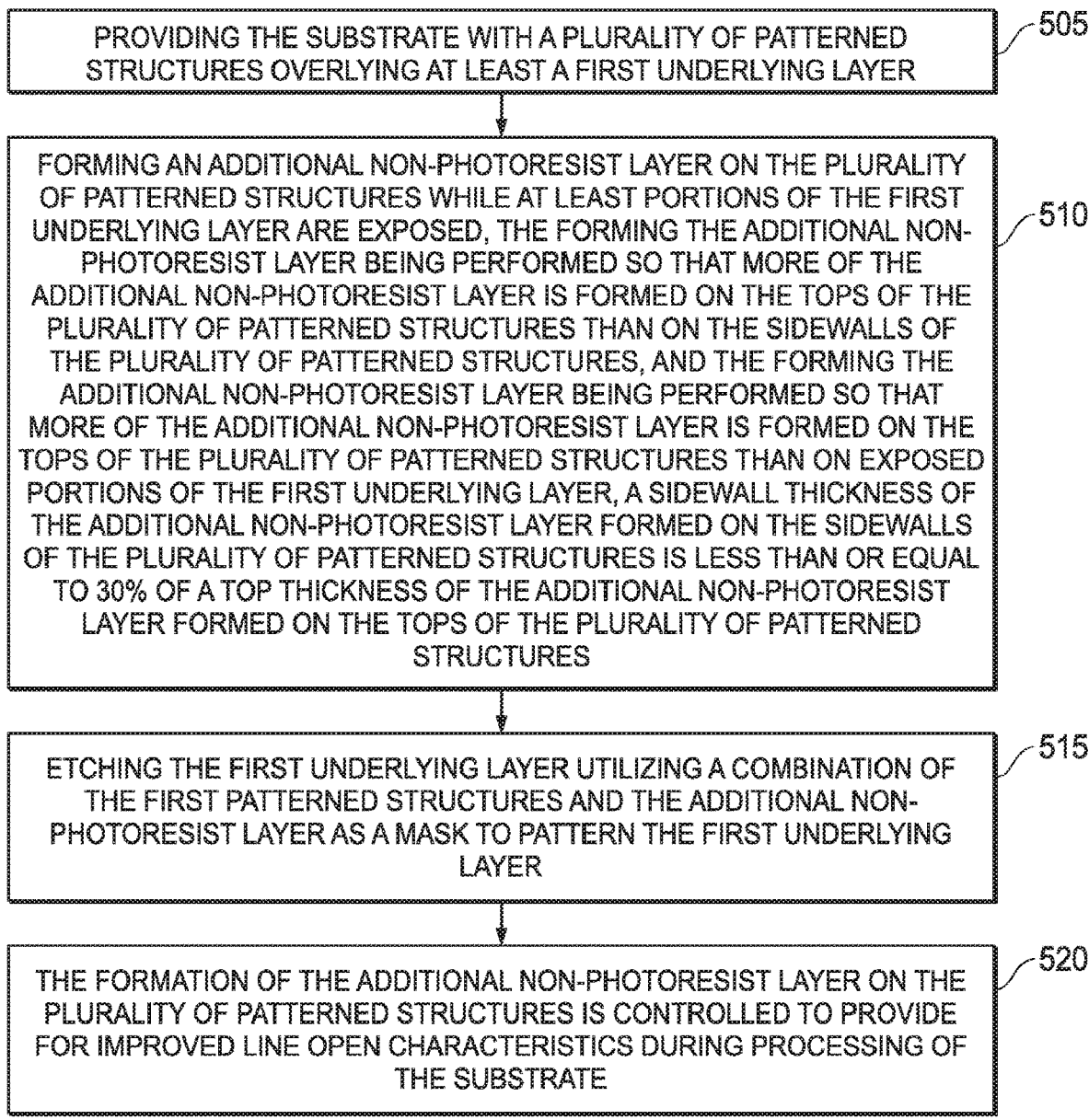
FIGS. 8-10 illustrate exemplary process flow charts for various embodiments of the substrate processing techniques disclosed herein.
Figure 9:
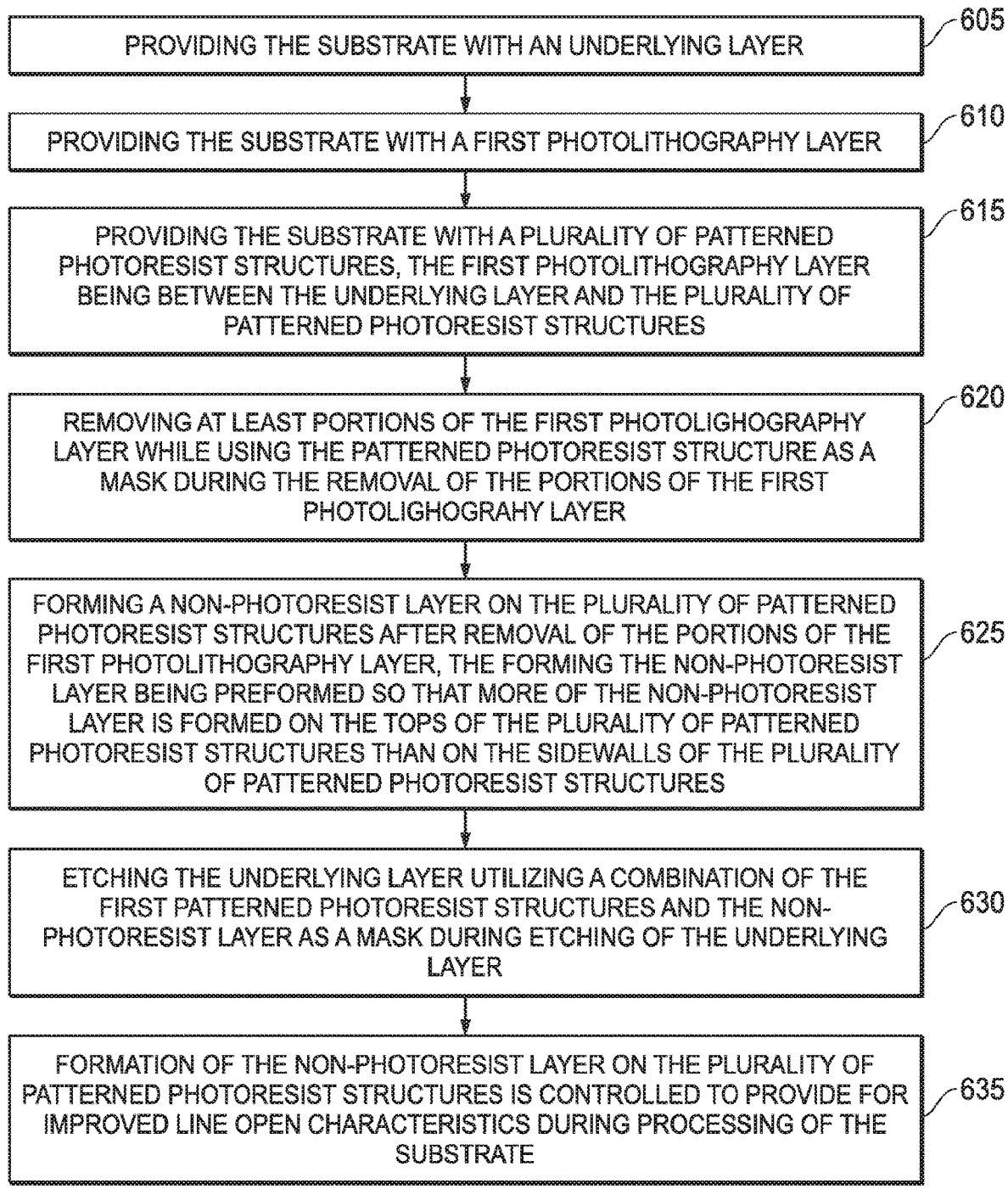
Figure 10:
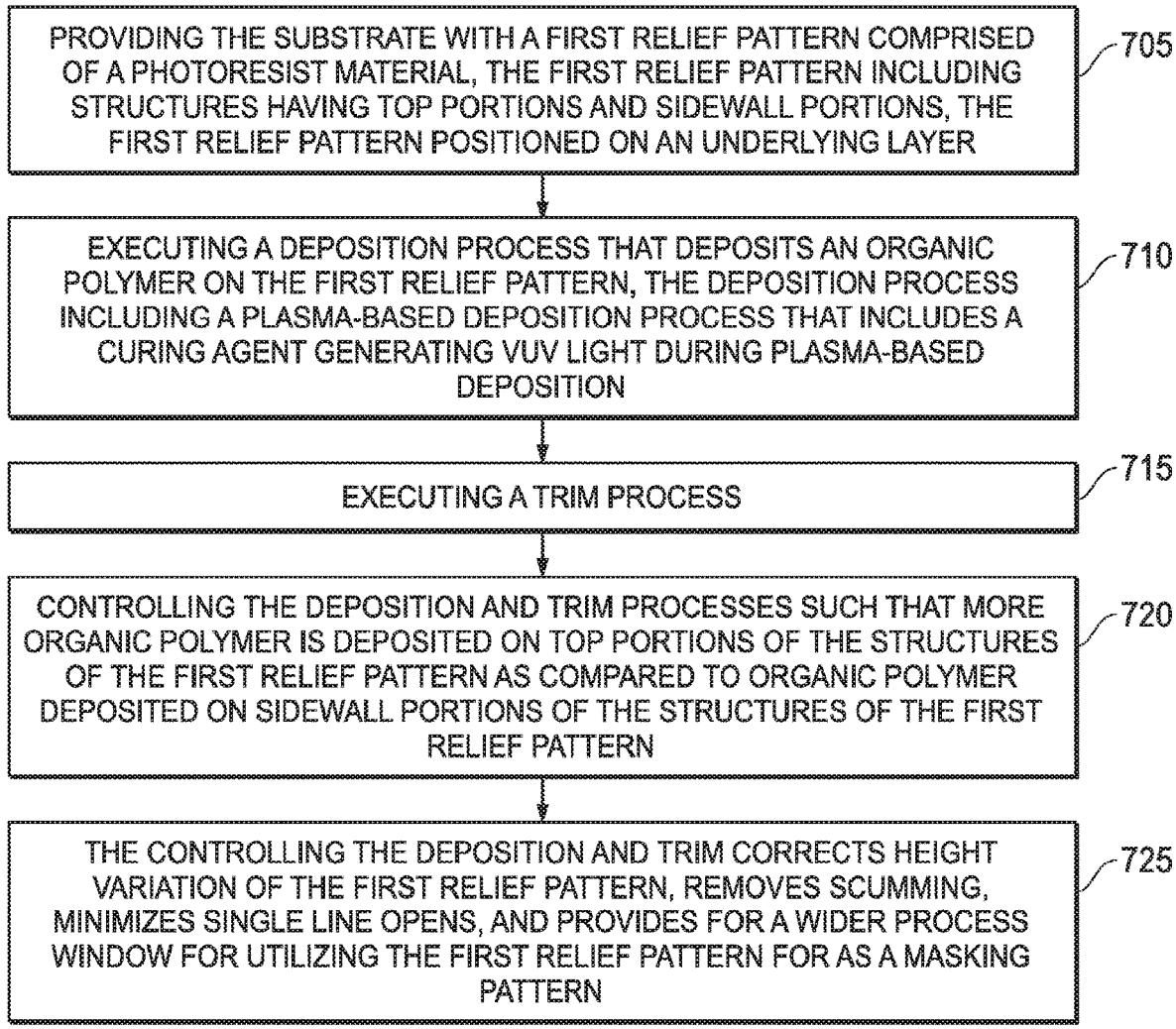

Exemplary process flows for utilizing the techniques described herein are provided in FIGS. 8-10. It will be recognized that these process flows are merely exemplary and the techniques described herein may be utilized in other manners. Further, it will be recognized that additional steps may be added to the exemplary process flows while still utilizing the advantageous benefits of the techniques disclosed herein. Additionally, it will be recognized by those skilled in the art that various steps of the process flows may be performed together or in combination, and thus, each step of the process flows is not limited to being a separate independent process step.

FIG. 8 illustrates a method for processing a substrate. The method may include a step 505 of providing the substrate with a plurality of patterned structures overlying at least a first underlying layer. The method may then include the step 510 of forming an additional non-photoresist layer on the plurality of patterned structures while at least portions of the first underlying layer are exposed. The forming the additional non-photoresist layer is performed so that more of the additional non-photoresist layer is formed on the tops of the plurality of patterned structures than on the sidewalls of the plurality of patterned structures. The forming the additional non-photoresist layer is also performed so that more of the additional non-photoresist layer is formed on the tops of the plurality of patterned structures than on exposed portions of the first underlying layer. A sidewall thickness of the additional non-photoresist layer formed on the sidewalls of the plurality of patterned structures is less than or equal to 30% of a top thickness of the additional non-photoresist layer formed on the tops of the plurality of patterned structures. The method may further comprise the step 515 of etching the first underlying layer utilizing a combination of the first patterned structures and the additional non-photoresist layer as a mask to pattern the first underlying layer. As indicated by step 520, the formation of the additional non-photoresist layer on the plurality of patterned structures is controlled to provide for improved line open characteristics during processing of the substrate.

FIG. 9 illustrates another method for processing a substrate. The method may include a step 605 of providing the substrate with an underlying layer and step 610 of providing the substrate with a first photolithography layer. The method may further comprise step 615 of providing the substrate with a plurality of patterned photoresist structures, the first photolithography layer being between the underlying layer and the plurality of patterned photoresist structures. The method further comprise step 620 of removing at least portions of the first photolithography layer while using the patterned photoresist structures as a mask during the removal of the portions of the first photolithography layer. The method further comprises step 625 of forming a non-photoresist layer on the plurality of patterned photoresist structures after removal of the portions of the first photolithography layer, the forming the non-photoresist layer being performed so that more of the non-photoresist layer is formed on the tops of the plurality of patterned photoresist structures than on the sidewalls of the plurality of patterned photoresist structures. The method also comprises step 630 of etching the underlying layer utilizing a combination of the first patterned photoresist structures and the non-photoresist layer as a mask during etching of the underlying layer. As indicated by step 635, the formation of the non-photoresist layer on the plurality of patterned photoresist structures is controlled to provide for improved line open characteristics during processing of the substrate.

FIG. 10 illustrates yet another method for processing a substrate. The method may include a step 705 of providing the substrate with a first relief pattern comprised of a photoresist material, the first relief pattern including structures having top portions and sidewall portions, the first relief pattern positioned on an underlying layer. The method further comprises step 710 of executing a deposition process that deposits an organic polymer on the first relief pattern, the deposition process including a plasma-based deposition process that includes a curing agent generating VUV light during plasma-based deposition. The method further comprises step 715 of executing a trim process. The method also comprises step 720 of controlling the deposition and trim processes such that more organic polymer is deposited on top portions of the structures of the first relief pattern as compared to organic polymer deposited on sidewall portions of the structures of the first relief pattern. As indicated at step 725, the controlling the deposition and trim corrects height variation of the first relief pattern, removes scumming, minimizes single line opens, and provides for a wider process window for utilizing the first relief pattern for as a masking pattern.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and describe herein and certain features of the inventions may be utilized independently of the use of other features, all as would be apparent to one skilled in the art after having the benefit of this description of the inventions.

What is claimed is:

1. A method for processing a substrate, the method comprising:
   providing the substrate with a first relief pattern comprised of a photoresist material, the first relief pattern including structures having top portions and sidewall portions, the first relief pattern positioned on an underlying layer;
   executing a deposition process that deposits an organic polymer on the first relief pattern, the deposition process including a plasma-based deposition process that includes a process chemistry including CxHy and a curing agent generating vacuum ultraviolet (VUV) light during plasma-based deposition;
   executing a trim process; and
   controlling the deposition and trim processes such that more organic polymer is deposited on top portions of the structures of the first relief pattern as compared to organic polymer deposited on sidewall portions of the structures of the first relief pattern,
   wherein the controlling the deposition and trim corrects height variation of the first relief pattern, removes scumming, minimizes single line opens, and provides for a wider process window for utilizing the first relief pattern as a masking pattern,
   wherein the curing agent is selected from argon, helium, hydrogen bromide, hydrogen, CxFy, xenon, or combinations thereof,
   wherein the process chemistry including CxHy includes $CH_4$, and
   wherein executing the trim process includes a gas chemistry of $CO_2$ and $CH_4$.

2. The method of claim 1, wherein the deposition process and the trim process comprises a plasma cyclic deposition and trim process including at least more than one cycle of deposition and trim steps.

3. The method of claim 2, wherein a trim step of the plasma cyclic deposition and trim process reduces line bridging.

4. The method of claim 1, wherein the deposition process and the trim process results in a reverse taper profile for the organic polymer formed on the structures of the first relief pattern.

5. The method of claim 4, wherein executing the deposition process, executing the trim process, and etching the first layer are different sub-steps of a single plasma processing step.

6. The method of claim 1, further comprising etching at least a first layer of the underlying layer utilizing a combination of the organic polymer and the first relief pattern as a mask.

7. The method of claim 6, wherein etching the first layer includes clearing the organic polymer from the top portions of the first relief pattern.

8. The method of claim 1, wherein the trim process includes clearing the organic polymer from the underlying layer.

9. The method of claim 1, wherein executing the deposition process deposits the organic layer on the sidewall portions of the first relief pattern.

10. The method of claim 1, wherein the underlying layer is an organic planarization material and providing the substrate includes providing the substrate with the first relief pattern positioned directly on the organic planarization material.

11. The method of claim 10, wherein providing the substrate includes providing the substrate with the first relief pattern including a BARC layer, and the first relief pattern, including the BARC layer, is positioned directly on the organic planarization material and wherein controlling the deposition includes controlling the deposition of organic polymer on the sidewalls of at least a portion of the BARC layer.

12. The method of claim 11, wherein the trim process includes clearing the organic polymer from the organic planarization material.

\* \* \* \* \*

UNITED STATES PATENT AND TRADEMARK OFFICE
CERTIFICATE OF CORRECTION

| | | |
|---|---|---|
| PATENT NO. | : 12,265,326 B2 | Page 1 of 2 |
| APPLICATION NO. | : 17/724898 | |
| DATED | : April 1, 2025 | |
| INVENTOR(S) | : Angélique D. Raley et al. | |

It is certified that error appears in the above-identified patent and that said Letters Patent is hereby corrected as shown below:

In the Drawings

In Figure 9, box 620, Lines 1 and 4, change "PHOTOLIGHOGRAPHY" to
-- PHOTOLITHOGRAPHY --.

In Figure 9, box 624, Line 4, change "PREFORMED" to -- PERFORMED --.

In Figure 10, box 725, Line 4, change "PATTERN FOR AS A MASKING" to -- PATTERN AS A MASKING --.

In the Specification

In Column 1, Line 10, change "utilizing very narrow pitch techniques, such used in extreme" to
-- utilizing very narrow pitch techniques, such as used in extreme --.

In Column 1, Lines 20-21, change "However, even shifting to EUV lithography, does not solve all of the" to -- However, even shifting to EUV lithography does not solve all of the --.

In Column 1, Lines 41-42, change "It would be desirable to provide a lithography integration technique that reduces that provides an improved process" to -- It would be desirable to provide a lithography integration technique that provides an improved process --.

In Column 1, Lines 56-57, change "In addition, the additional layer may be preferential formed on the top of the" to -- In addition, the additional layer may be preferentially formed on the top of the --.

In Column 3, Line 6, change "pattern for as a masking pattern." to -- pattern as a masking pattern. --.

In Column 4, Line 17, change "Other additional layers, such as an etch stop layers," to -- Other additional layers, such as etch stop layers, --.

Signed and Sealed this
Twenty-fourth Day of June, 2025

Coke Morgan Stewart
*Acting Director of the United States Patent and Trademark Office*

CERTIFICATE OF CORRECTION (continued)
U.S. Pat. No. 12,265,326 B2

In Column 6, Lines 36-37, change "In some embodiments, the deposition process and the trim process can be cycled create a predetermined amount of" to -- In some embodiments, the deposition process and the trim process can be cycled to create a predetermined amount of --.

In Column 6, Lines 55-58, change "Thus, ability to selectively form the organic polymer layer ... will limiting formation on ... will depend upon the" to -- Thus, ability to selectively form the organic polymer layer ... limiting formation on ... will depend upon the --.

In Column 6, Line 62, change "provides advantages differential deposition as compared to" to -- provides advantageous differential deposition as compare to --.

In Column 7, Line 8, change "In one embodiment, an silicon antireflective layer may be" to -- In one embodiment, a silicon antireflective layer may be --.

In Column 7, Lines 24-25, change "plasma processes, all as would be recognized by thus skilled in the art." to -- plasma processes, all as would be recognized by those skilled in the art. --.

In Column 7, Line 49, change "use of a an additional top coating on" to -- use of an additional top coating on --.

In Column 7, Lines 56-57, change "herein which provide improved process window characteristics to minimize and reducing line bridging and scumming" to -- herein which provide improved process window characteristics to minimize and reduce line bridging an scumming --.

In Column 9, Lines 4-5, change "The method further comprise step 620 of removing at least" to -- The method further comprises step 620 of removing at least --.

In Column 9, Lines 44-45, change "process window for utilizing the first relief pattern for as a masking pattern." to -- process window for utilizing the first relief pattern as a masking pattern. --.